United States Patent
Gerber et al.

(10) Patent No.: US 8,430,969 B2
(45) Date of Patent: Apr. 30, 2013

(54) METHOD FOR EXPOSING AND CLEANING INSULATING COATS FROM METAL CONTACT SURFACES

(75) Inventors: Mark A Gerber, Lucas, TX (US); Kurt P Wachtler, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 368 days.

(21) Appl. No.: 12/823,485

(22) Filed: Jun. 25, 2010

(65) Prior Publication Data

US 2011/0011424 A1   Jan. 20, 2011

Related U.S. Application Data

(60) Provisional application No. 61/226,905, filed on Jul. 20, 2009.

(51) Int. Cl.
*B08B 7/00* (2006.01)

(52) U.S. Cl.
USPC .................. 134/19; 134/1.3; 134/2; 134/4

(58) Field of Classification Search .................. None
See application file for complete search history.

(56) References Cited

U.S. PATENT DOCUMENTS 5,716,457 A * 2/1998 Hayes et al. .................. 134/26

* cited by examiner

*Primary Examiner* — Eric Golightly
(74) *Attorney, Agent, or Firm* — Steven A. Shaw; W. James Brady; Frederick J. Telecky, Jr.

(57) ABSTRACT

A process flow exposing and cleaning contact surfaces employing a liquid cleaning agent such as flux to penetrate the interface between the glassy coats and the surface of metal and to delaminate the coats from the metal, and then, at elevated temperatures, to use the agent's vapor pressure to break up the glassy coats into smaller pieces. The glassy coats are prevented by their low density to penetrate into the molten solder. Finally, at ambient temperature, the floating filler debris is water-washed and rinsed away. Cleaning agents include low-viscosity liquids (oils) and flux, which do not decompose at elevated temperatures and are mixed with components operable to provide, at the elevated temperatures, the fumes for sufficient vapor pressure to break up and dislodge the coats from the metal contacts.

9 Claims, 3 Drawing Sheets

METHOD FOR EXPOSING AND CLEANING INSULATING COATS FROM METAL CONTACT SURFACES

FIELD OF THE INVENTION

The present invention is related in general to the field of semiconductor devices and processes and more specifically to the fabrication method of solder connections to metal contacts of a device, which is covered by an insulating layer so that windows have to be opened to expose the contacts.

DESCRIPTION OF RELATED ART

It has been common practice for several decades to connect semiconductor devices to external parts such as printed circuit boards by soldering. The solder may be provided by a paste, a previously deposited solder amount, or by a solder ball. The solder connection technology has recently been extended to an emerging product family called package-on-package (PoP) devices, wherein a top device package is aligned with a bottom device package, and the output terminals of the top package are connected with the input terminals of the bottom package. Commonly, the connection of terminals is achieved by reflowing the solder body attached to each output terminal of the top package to wet the respective terminal of the bottom package. The terminals of the bottom package may be prepared in various configurations, for instance as a pad made of copper covered by thin layers of solderable metals such as gold, palladium, or as another solder ball.

In today's semiconductor products, PoP devices enjoy increasing popularity, because they promise to use component devices already developed and thus quickly available. For instance, examples for mobile multimedia applications include the three-dimensional integration of baseband integrated circuits (ICs) or application-specific circuits (ASICs) with high-performance memory. PoP devices are supposed to accept packages wherein the chip is assembled by wire bonds, as well as packages wherein the chip is assembled by flip-chip technology. Further, PoP devices are expected to be robust in terms of reliability in use-tests under variable temperature and moisture conditions, this means they should not experience package warpage, open solder connections, or decreased performance.

For the bottom device, while the chip and its connections in the central region of the substrate may be molded in a plastic compound, until recently the rows of input terminals (capture pads) remained free of overmold and were typically arrayed along the perimeter of the device substrate. In newer devices, however, the substrate has become so thin that it would warp if it would not be supported by an overmold structure extending across the whole substrate area. In addition, in order to find an approach for PoP's to increase the number of I/O's while maintaining the area of the device, the industry is recently using a method for the bottom device to attach first conductive bumps to the top substrate surface terminals, and then to encapsulate the bumps together with the mounted chip in a molding compound. In order to bring the coefficient of thermal expansion (CTE) of the polymeric precursor closer to the CTE of silicon, the precursor has to include between 80 and 90% fillers of inorganic particles such as silicon dioxide and silicon carbide. The bump height can be adjusted within a 0.010 to 0.015 mm range. Thereafter, blind vias are opened, usually by lasers, through the molding compound over the conductive bumps to reach and expose the top of the conductive material. The apertures of the vias are wide enough to accommodate the connecting solder bodies of the top package. For the stacking operation of the top package onto the bottom package, an automated placement machine equipped with a flux or solder paste dipping module positions the solder bodies of the top package inside the via apertures of the bottom package to make contact with the bumps in the vias. After reflowing the solder (at about 260° C.), a conductive connection is created from the bottom to the top device terminals.

SUMMARY OF THE INVENTION

Applicants recognized that the PoP approach of packaging the bottom device in an overmolding compound including inorganic filler particles, and then opening the apertures with lasers to expose the contact pads lends itself to higher I/O's numbers and finer pitch, but that this approach, until now, did not deliver the needed high assembly yield and reliability test data. Significantly, unacceptably high numbers of open contact failures have been observed between the solder balls of the top device and the metal contact of the bottom device, both for bottom devices fabricated with gold-clad copper contact pads and for bottom devices fabricated with solder balls on the pads.

Analyzing the open contact failures, applicants discovered that the lasers employed to open the via apertures generate local temperatures in the compound high enough to fuse some of the inorganic filler particles (mostly rounded silicon dioxide, 80 to 90 weight %) into thin glassy coats deposited onto the contacts. Frequently, these glassy coats and patches adhere to the contacts strong enough to resist water washing and other clean-up methods. As a consequence, the glassy coats tend to remain on the surface of both solder and gold contacts and inhibit reliable contact with the solder of the top device.

Applicants solved the problem of ensuring reliable contact between solder balls and clean contact metals by a process flow, which employs a liquid cleaning agent such as flux first to penetrate the interface between the glassy coats and the metal surface and to delaminate the coats from the metal, and then, at elevated temperatures, to use the vapor pressure of the fumes of the cleaning agent to break up the glassy coats into smaller pieces. Should the elevated temperature during the agent clean-up cause the solder of the bottom device to reflow, the glassy coats are prevented by their low density to penetrate into the molten solder. Finally, at ambient temperature, the floating filler debris is water-washed and rinsed away; the clean metal contacts are then ready to be connected reliably to the solder of the top device. When flux is used, the abietic acid of the flux and the ammonia and hydrochlocic acid of any activators added to the flux deoxidize the metal surfaces.

Generally, the cleaning agents include low-viscosity liquids, such as certain oils, which do not decompose at elevated temperatures and are mixed with components operable to provide, at the elevated temperatures, enough fumes of sufficient vapor pressure to break up and dislodge the coats from the metal contacts. When flux is chosen as a cleaning agent, it may be selected from a group including rosin, rosin with activators, organic water soluble flux, and inorganic water soluble flux.

It is a technical advantage of the invention that the fabrication method of the PoP bottom device, including the step of encapsulating the top side in molding compound, may proceed in strip form; the singulation into discrete devices by sawing becomes the last process step. As a result, the molding step provides each discrete device with a maximum amount of the robust molding material, contributing significantly to minimize any device warpage during the temperature excursion for assembling the PoP.

It is another technical advantage that the break-up of glassy coats by the vapor pressure of flux fumes is applicable to any metal surface originally covered by the overmolding compound, for example solder and gold-clad copper.

In another technical advantage of the invention, the overmolded bottom device may include one or more wire-bonded chips, giving the PoP the advantage of using existing chips for increased performance.

DETAILED DESCRIPTION OF THE PREFERRED EMBODIMENTS

Figure 1:
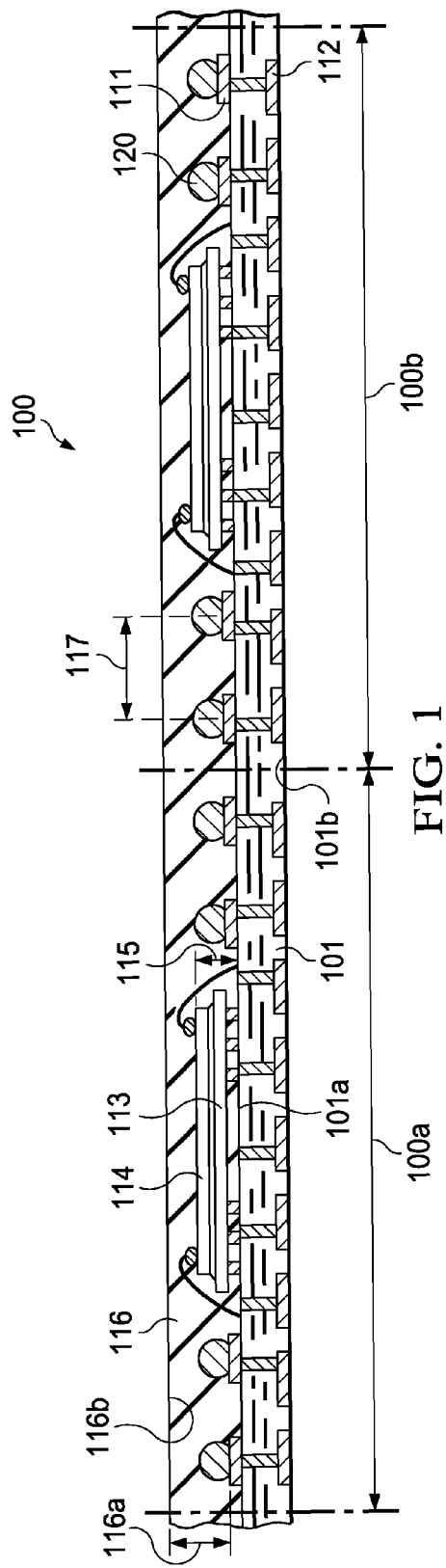
FIG. 1 shows a schematic cross section of a portion of a substrate strip including solder-covered contact pads and assembled semiconductor chips in a package of encapsulation compound.
Figure 2:
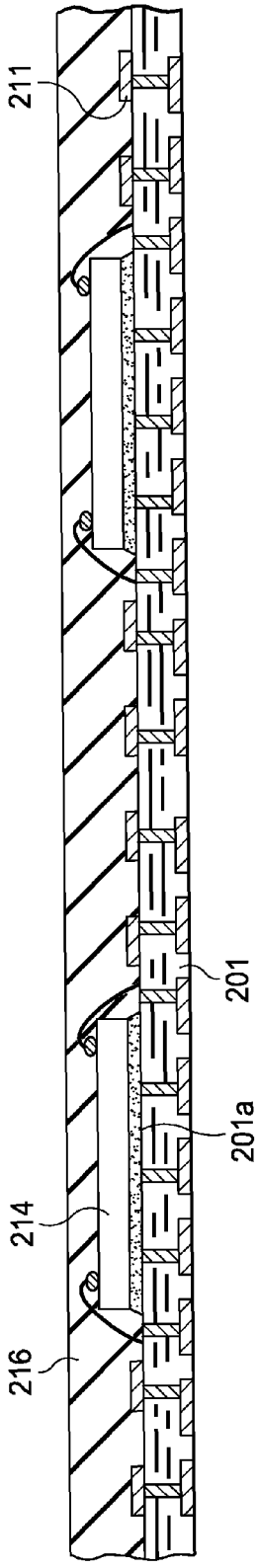
FIG. 2 is a schematic cross section of a portion of a substrate strip including metal contact pads and assembled semiconductor chips in a package of encapsulation compound.
Figure 3:
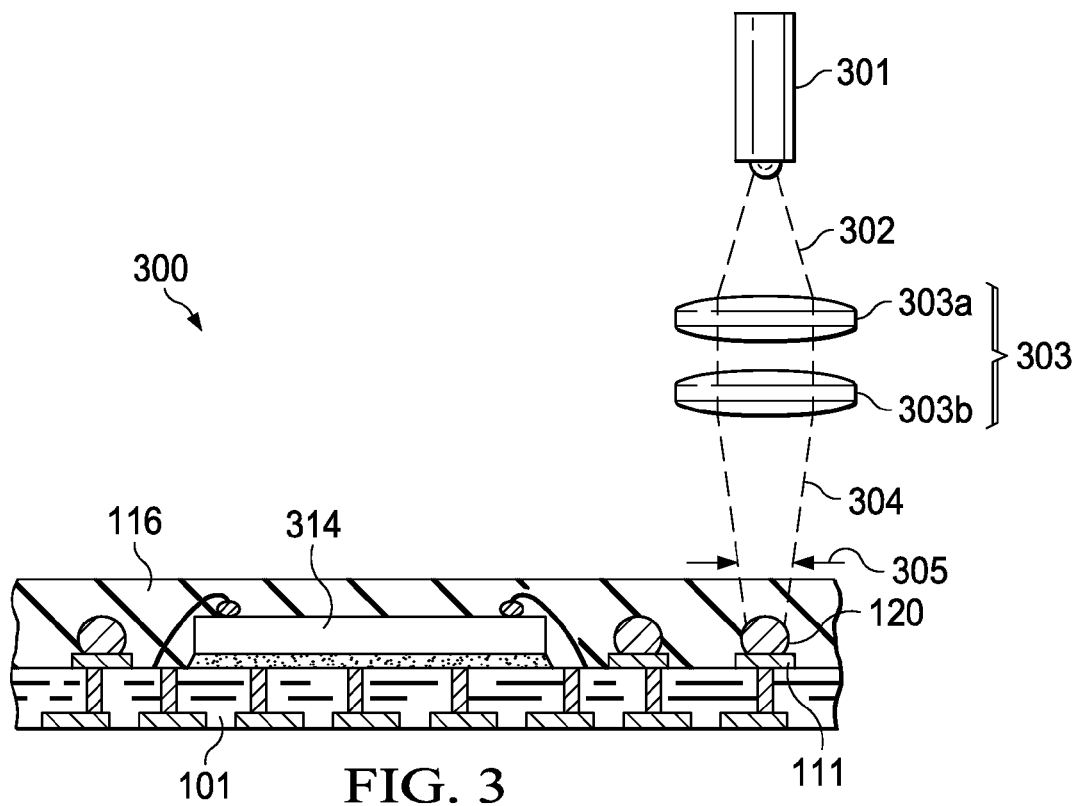
FIG. 3 illustrates schematically the process step of opening apertures through an encapsulation compound by laser energy to expose buried solder bodies on contact pads of a substrate.
Figure 4:
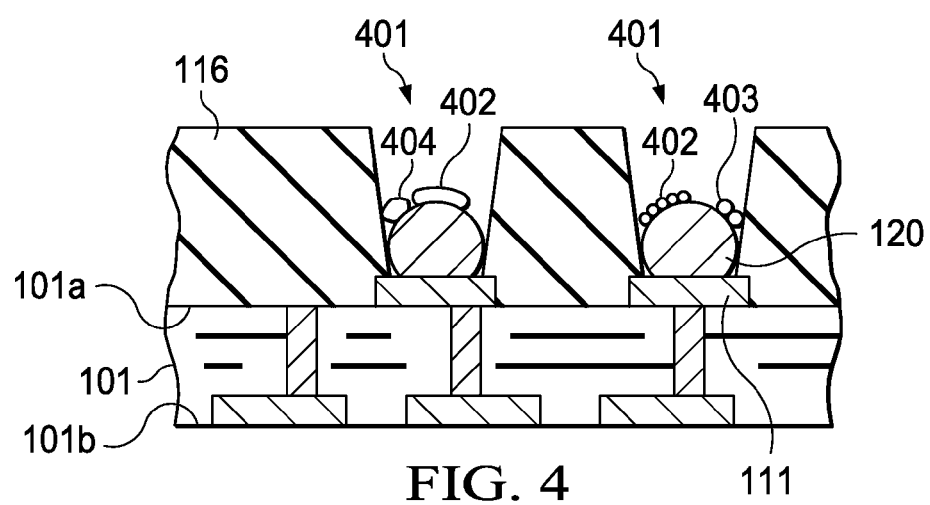
FIG. 4 depicts schematically the result of the aperture opening, including insulating coats and particulate debris adhering to the pad surfaces.
Figure 5:
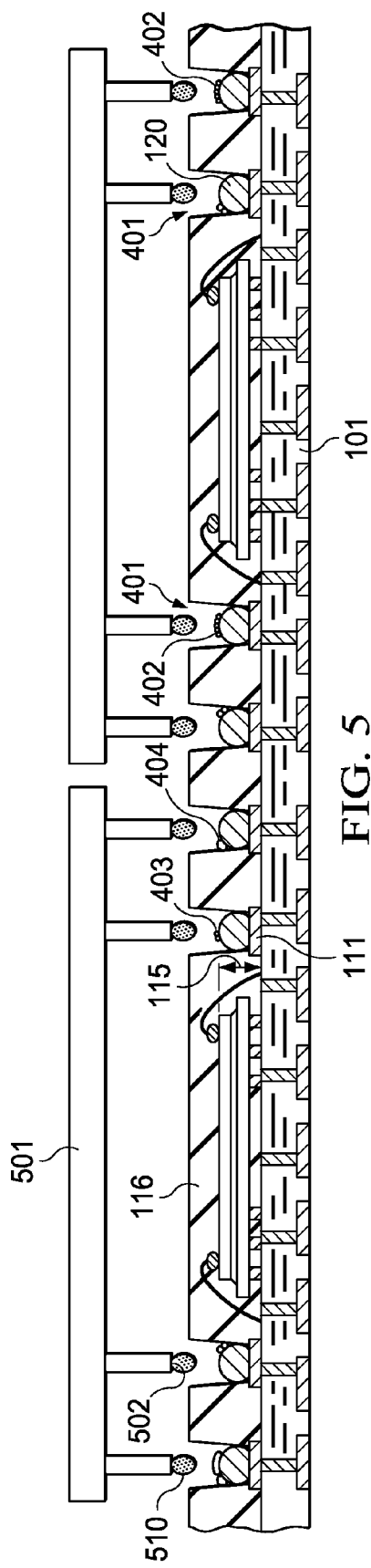
FIG. 5 shows schematically the setup for the process step of distributing cleaning agent into the apertures.
Figure 6:
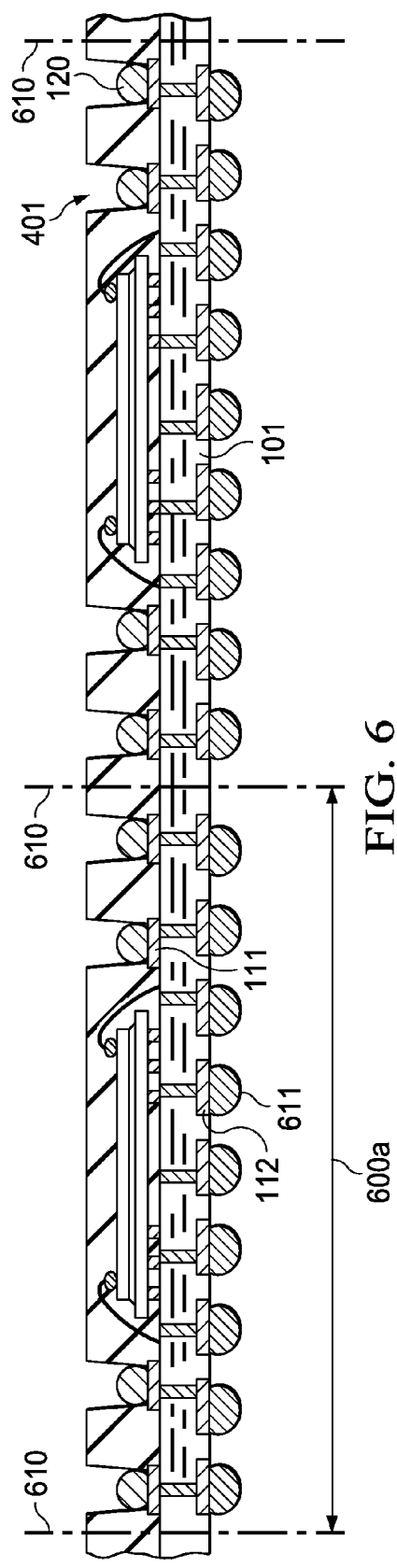
FIG. 6 illustrates schematically the resulting clean contact pads and apertures after heating the cleaning agent and washing the debris; solder balls are attached to the substrate pads opposite the apertures.

FIGS. 1 to 3 depict exemplary semiconductor products at certain stages of their fabrication process to illustrate embodiments of the invention. FIGS. 4 to 6 show steps and results of the cleaning method. Referring now to FIG. 1, the semiconductor device generally designated 100 includes a strip of substrate 101 made of an insulating material yet integral with conductive lines and vias. Substrate 101 has a first side 101*a* and a second side 101*b*. On first side 101*a* are first contact pads 111, and on second side 101*b* are second contact pads 112. First and second contact pads are preferably made of copper or aluminum. Substrate 101 includes a plurality of sites 100*a*, 100*b*, etc. for assembling semiconductor chips and fabricating units of semiconductor devices.

The area of each substrate site 100*a*, 100*b*, etc. is divided into a region, preferably in the approximate center of the of the site area, which is reserved for assembling semiconductor chips. Dependent on the device type and the chip thickness (preferably between 75 and 200 µm), a device may include one or more chips. In the example of FIG. 1, the central region of each site shows a stack 115 of two chips assembled: one chip 113 has metal bumps for flip-attaching chip 113 to the substrate 101; the other chip 114 is adhesively attached to chip 113 and wire-bonded to substrate 101. In other devices, there may be multi-chips assembled adjacent to each other; the chips may be flip-assembled or wire bonded in any combination. Distributed in the area of the substrate periphery are first contact pads 111 on the first substrate side 101*a*. Pads 111 have a solderable metallurgical surface configuration, such as a thin layer of a noble metal (gold or palladium). Neighboring first contact pads have a pitch 117 center-to-center.

As FIG. 1 shows, the first substrate side 101*a*, including the chip stack 115, is encapsulated in a compound 116, forming a package with a compound height 116*a* above contact pads 111. The package height 116*a* will increase with the number and thickness of the stacked chips and the arch of the bonding wires used for chip assembly. A preferred device encapsulation is formed by a molding compound, which includes an epoxy-based binder and between 80 and 90 weight % inorganic non-conductive filler particles, preferably made of round silicon dioxide particles. The filler particles are needed for providing mechanical strength to the device and reducing the compound coefficient of thermal expansion (CTE). The top surface 116*b* of the compound is the top surface of the device.

As FIG. 1 shows, the encapsulation compound also covers all solder balls 120, which have been deposited on the contact pads 111 before the devices are encapsulated. For forming the solder balls 120, a selected amount of solder paste, or a prefabricated solder body, is placed on each contact pad 111. Preferred solders are free of lead and include eutectic alloys of tin and at least one metal such as silver, copper, and bismuth. By reflowing the solder alloy at temperatures somewhat above the eutectic temperature, the solder is wetting the area of each pad 111 and acquiring an approximately spherical body shape as determined by the surface tension of the molten solder alloy. Due to its shape, the solder body is commonly referred to as solder ball. The quasi-spherical shape is preserved after cooling to ambient temperature.

FIG. 2 illustrates a semiconductor product analogous to the product shown in FIG. 1 for a substrate strip 201 with only a single chip 214 per device unit assembled by bonding wire on the substrate surface 201*a*. The substrate metal pads 211 have a solderable surface, but are free of a deposited and reflowed solder ball. Pads 211 and chip 214 with its bonding wires are encapsulated by a molding compound 216, which preferably consist of an epoxy-based molding compound with 80 to 90 weight % rounded filler particles made of silicon dioxide.

The following considerations equally hold for devices with solder balls as shown in FIG. 1, with metal pads (especially metal contacts) as illustrated in FIG. 2, and generally with bodies made of a distinct material, when these balls, pads, or bodies are covered by a compound including a polymeric binder and fillers made of inorganic non-conductive particles. Consequently, it should be stressed that the considerations are valid for all these device variations, even when the figures (FIGS. 3 to 6) can only display specific examples and the figure descriptions have to be specific to these figures. Since the figures are selected from the realm of electronic devices having electrical terminals, these balls, metal pads, and bodies are herein referred to as terminal bodies.

The process steps of creating apertures to expose terminals bodies (solder balls 120 and pads 211, respectively) are summarized in FIG. 3. A portion of the semiconductor device-in-process, generally designated 300, includes substrate strip 101 with metal contact pads 111, terminal bodies 120 attached to pads 111, a mounted and wire bonded chip 314, and molding compound 116, which includes 80 to 90 weight % filler particles. FIG. 3 further indicates a high power optical system, such as a laser system, which can be focused to successively remove small volumes of the encapsulation compound 116 in order to create grooves and eventually an aperture at locations of the encapsulation selected so that an aperture would expose a solder ball 120. The optical source 301 generates the output 302 of light energy, preferably laser light. A suitable laser example is a CW Q-switched diodepumped Nd:Yag laser (neodymium:yttrium-aluminum-garnet crystal, wavelength 1064 nm, Q-switch frequency 70 kHz) for 100 W total power and about 20 W output power (such as Electro Optics SLD 402). As FIG. 3 illustrates, the preferred embodiment includes optics 303*a* to collimate the light 302, and optics 303*b* to transform parallel light into convergent light 304. As an example, the diameter 305 of the focused light may be adjusted so that it represents approximately the diameter of solder ball 120.

The focused light energy impinging on the surface of encapsulation 116 affects the polymeric binder and the inorganic non-conductive filler particles of the encapsulation compound in several ways. The light energy is locally absorbed by the compound, causing locally intense heating of a surface-near volume of the compound. The heat changes the chemical configuration of the compound, similar to heat treated or burnt resin; the polymeric binder is decomposed and the filler particles are unleashed. The decomposition is energetic enough to expel progressive portions of the reaction products, which are piling up on the surrounding cooler compound parts or are becoming airborne; other portions of the filler particles are superficially fused together as patches, which sink deeper into the progressing aperture. Finally, an aperture into and through the encapsulation compound is created at the location, where the laser energy was impinging, and the surface of the buried terminal body 120 is exposed. In the opening process, however, filler particles, patches of partially fused particles, and decomposed polymers are ending up re-deposited on the solder ball surface as coats, which adhere to the solder surface.

The results of the laser-operated aperture opening process are summarized schematically in FIG. 4. The displayed portion of substrate 101 has two terminal bodies 120 attached to metal pads 111 on the first substrate surface 101*a*. Each terminal body has been exposed by an aperture 401 opened by focused laser energy through the encapsulation material 116, which includes a polymeric binder and inorganic non-conductive filler particles. FIG. 4 shows that adhering to wide surface portions of the terminal bodies are random re-deposited particles 403, coats 402 of partially fused particles, and debris 404 of the decomposed binder. As long as these bodies 402, 403, and 404 are adhering to the solder surface, they cannot be washed out by rinsing and would thus be inhibiting any intended use of the solder for connection by a reflow step.

FIG. 5 displays an example of the cleaning method according to the invention by applying the method to the exemplary substrate 101 with semiconductor devices 115, packaged in a polymeric encapsulation 116 with filler particles, after the apertures 401 through the encapsulation material have been opened by laser energy, exposing terminal bodies 120. The terminal bodies may be solder balls, as shown in FIG. 5; alternatively, they may be a metal pad cover with a thin gold layer, or any metal pad with a solderable surface. As FIG. 5 schematically indicates, the terminal bodies 120 have, as a consequence of the aperture opening process by laser energy, coats 402 of non-conductive filler particles ($SiO_2$) adhering to the body surface, in addition to random deposited debris 404 of decomposed polymeric material and unleashed particles 403 (mostly $SiO_2$). The solder balls may also have an oxidized surface; a gold-layer pad, on the other hand, would be free of an oxidized surface. Due to the coats and particles adhering to the terminal body surfaces, conventional clean-up methods of washing, rinsing, or plasma treatment would not be effective as clean-up steps at this stage.

In the cleaning step of the invention shown in FIG. 5, one or more droplets 510 of a cleaning agent are distributed onto the surface of terminal body 120 in each aperture 401. FIG. 5 depicts schematically a tool 501 with a plurality of nozzles 502 to dispose these droplets simultaneously in a plurality of apertures 401. Generally, the cleaning agents include low-viscosity liquids, such as certain oils, which do not decompose at elevated temperatures and are mixed with components operable to provide at elevated temperatures enough fumes of sufficient vapor pressure to break up and dislodge the coats from the terminal body surface. Preferably, flux is used as a cleaning agent (active ingredients include abietic acid, dehydro abietic acid, leviopmaric actid (1,2)). When flux is chosen as a cleaning agent, it may be selected from a group including rosin, rosin with activators (creating ammonia or hydrochlorid acid), organic water soluble flux, and inorganic water soluble flux. Flux has the additional ability to deoxidize metal surfaces at high temperatures (without decomposing).

The cleaning agents penetrate the interfaces between the surface of the terminal body and the coats (mostly $SiO_2$), particles, and debris. There is no rinsing right after applying the cleaning agent; rather, in the next process step, the temperature is raised from ambient temperature to heat the cleaning agent into a range, where the generated vapor pressure is sufficient to break up the coats on the terminal body surface into smaller fractions and dislodge the coats fractions from the terminal body surface. In cases where the temperature range is higher than the solder reflow temperature so that the solder is liquefied, the coat fractions, particles and debris will not penetrate the molten solder because of their low density compared to solder density. For example, liquid pure tin has a density of about 7.30 $g/cm^3$; in contrast, the density of glass ($SiO_2$) is about 2.83 $g/cm^3$, of flux or oil is about 1.05 $g/cm^3$, and of carbonized slag between about 0.86 and 0.96 $g/cm^3$. The dislodged particles remain loosely floating on the terminal surface until the temperature is lowered to ambient temperature and the solder is again solidified.

In the last process step, the dislodged coat fractions, particles, and debris are washed from the terminal body surfaces and rinsed away. The surfaces of terminals 120 and the apertures 401 are now cleaned, as illustrated in FIG. 6. Next, solder balls 611 can be attached to second contact pads 112 of substrate 101. Substrate 101 with the assembled and packaged semiconductor chips, cleaned apertures 401 and solders 120 is ready to enter subsequent processing steps.

An example of further processing is a step of singulation of the substrate strip (for instance by a sawing technique) along separation lines 610 to create discrete device units. Another example is a step of assembling a package-on-package (PoP) device. In this assembly, a device unit 600*a*, with its cleaned apertures 401 and solders 120, becomes the bottom device of the PoP; another packaged semiconductor device, which has external solder balls in locations matching the apertures 401, becomes the top device. The solder balls of the top device are aligned with the apertures 401 of the bottom device; the top device is then lowered to bring the solder balls of the top device in contact with solders 120 of the bottom device. At the solder reflow temperature, the solders of bottom and top device are unified; after cooling to ambient temperature, the PoP assembly is completed.

In the site preparation of the invention, the sequence of steps in the process flow performs the clean-up step first and the assembly step (soldering) thereafter; when flux is used, it is employed first as cleaning agent and thereafter as an enabler of soldering. In contrast, in known art the assembly step (soldering) is performed concurrent with the clean-up step.

According to the invention, the cleaning agent is heated to use the vapor pressure of its fumes to break up coats of non-conducting material located on the surface of a solder body. In contrast, in known art flux and activators are used primarily to deoxidize the solder.

According to the invention, the additional cleaning and rinsing steps are inserted into the process flow between the step of creating apertures and the step of attaching solder balls to substrate contact pads opposite the apertures. In contrast, in known art the step creating apertures is followed directly by the step of attaching solder balls to substrate contact pads opposite the apertures.

The above listed principles of the invention are not restricted to cleaning and connecting metal contacts (such as solder bodies and copper pads with solderable surfaces) of semiconductor devices, but can be used for cleaning contamination coats and for subsequent connecting of conductive contacts in any assembly operation, which can tolerate elevated temperatures for vapor pressure formation. Examples include breaking up and removing coats on contact pads in mother boards, cleaning of metal spring contacts, and removing debris from exposing buried contacts.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type and any number of semiconductor chips, discrete or integrated circuits; it further applies to combinations of active and passive components, and to any material of the semiconductor chips including silicon, silicon germanium, gallium arsenide, or any other semiconductor or compound material used in semiconductor manufacturing.

As another example, the apertures may be shaped as cylinders or as inverted truncated cones. There may be one, or two, or more drops of cleaning liquid deposited on the coat-covered contact and solder balls at the bottom of the apertures. The via holes may have been pre-filled with one, two, or more solder balls. In PoP assembly, there may be an additional oxide-removing flux step concurrent with the reflow step of a top device, when the bottom device with the cleaned contacts has been stored over extended periods of time.

It is therefore intended that the appended claims encompass any such modifications or embodiment.

We claim:

1. A method for processing a semiconductor device comprising:
   covering a semiconductor device having a metal contact surface with an insulating compound including a polymeric binder filled with inorganic non-conductive particles;
   locally heating volumes of the compound, decomposing the binder and unleashing the particles, to progressively create an aperture through the compound and expose the metal contact surface including a plurality of coats of re-deposited and partially fused particles adhering to the metal contact surface;
   depositing a cleaning agent onto the insulated semiconductor device to penetrate interfaces between the metal contact surface and the plurality of coats;
   heating the cleaning agent to create vapor pressure for breaking up and dislodging the plurality of coats from the metal contact surface; and
   rinsing the dislodged plurality of coats from the metal contact surface, cleaning the insulated semiconductor device.

2. The method of claim 1 wherein the metal is selected from a group including solder, copper having a surface layer of a noble metal, aluminum having a surface layer of a noble metal, and a metal having a solderable surface.

3. The method of claim 2 wherein the metal contact is an electrical contact.

4. The method of claim 3 wherein the insulating compound is electrically non-conductive.

5. The method of claim 4 wherein the cleaning agent is a flux selected from a group including rosin, rosin with activators, organic water soluble flux, and inorganic water soluble flux.

6. The method of claim 5 wherein heating the flux further includes deoxidizing the metal contact surface.

7. The method of claim 1 wherein rinsing further includes removing flux residue and debris formed by locally heating of the compound.

8. The method of claim 1 wherein the polymeric binder is an epoxy-based molding compound and the inorganic non-conductive filler particles are silicon dioxide particles.

9. The method of claim 1 wherein the local heating is performed by a focused laser.

\* \* \* \* \*